United States Patent
Arp et al.

(10) Patent No.: US 9,754,063 B2
(45) Date of Patent: Sep. 5, 2017

(54) REDUCING DYNAMIC CLOCK SKEW AND/OR SLEW IN AN ELECTRONIC CIRCUIT

(71) Applicant: INTERNATIONAL BUSINESS MACHINES CORPORATION, Armonk, NY (US)

(72) Inventors: Andreas Arp, Boeblingen (DE); Fatih Cilek, Boeblingen (DE); Guenther Hutzl, Boeblingen (DE); Michael Koch, Boeblingen (DE); Matthias Ringe, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/941,847

(22) Filed: Nov. 16, 2015

(65) Prior Publication Data

US 2016/0140280 A1     May 19, 2016

(30) Foreign Application Priority Data

Nov. 17, 2014  (GB) .................................. 1420364.0

(51) Int. Cl.
G06F 17/50     (2006.01)
G06F 1/10      (2006.01)

(52) U.S. Cl.
CPC ............ *G06F 17/5072* (2013.01); *G06F 1/10* (2013.01); *G06F 17/5068* (2013.01)

(58) Field of Classification Search
USPC ....................................................... 716/108
See application file for complete search history.

(56) References Cited

U.S. PATENT DOCUMENTS

| | | |
|---|---|---|
| 5,656,963 A | 8/1997 | Masleid et al. |
| 5,668,484 A | 9/1997 | Nomura |
| 6,502,222 B1 | 12/2002 | Tetelbaum |

(Continued)

OTHER PUBLICATIONS

Xiao et al., "Local Clock Skew Minimization Using Blockage-Aware Mixed tree-Mesh Clock Network," ICCAD '10 Proceedings of the International Conference on Computer-Aided Design, (Conference Date: Nov. 7, 2010) pp. 458-462.

(Continued)

*Primary Examiner* — Mohammed Alam
(74) *Attorney, Agent, or Firm* — Margaret A. McNamara, Esq.; Kevin P. Radigan, Esq.; Heslin Rothenberg Farley & Mesiti

(57) ABSTRACT

Reducing dynamic clock skew and/or slew in an electronic circuit is provided by: referencing a layout database and/or netlist of a design for the electronic circuit; identifying a set of neighboring buffer pairs with active buffers and adjacent sub-meshes, which are connected by a shorting bar; for each neighboring buffer pair of the set: placing a dummy buffer for each of their active buffers in the adjacent sub-meshes close to the active buffers; routing an input of a first dummy buffer located in a first sub-mesh to an output of an active buffer in a second sub-mesh; routing an input of a second dummy buffer located in the second sub-mesh to an output of an active buffer in the first sub-mesh; and connecting inputs of the first and second dummy buffers to the shorting bar.

20 Claims, 9 Drawing Sheets

(56) References Cited

U.S. PATENT DOCUMENTS

| | | |
|---|---|---|
| 7,301,385 B2 | 11/2007 | Takano et al. |
| 7,392,495 B1 | 6/2008 | Cherukupalli et al. |
| 7,679,416 B2 | 3/2010 | Cheng et al. |
| 8,099,702 B2 | 1/2012 | Hou et al. |
| 8,214,790 B2 | 7/2012 | Masleid et al. |
| 8,525,569 B2 | 9/2013 | Bucelot et al. |
| 2008/0066043 A1* | 3/2008 | Lin .................. G06F 17/505 326/93 |
| 2008/0229265 A1* | 9/2008 | Bueti ............... G06F 17/5045 716/113 |
| 2009/0237134 A1* | 9/2009 | Hwang ................. G06F 1/10 327/165 |
| 2009/0254874 A1* | 10/2009 | Bose ............... G06F 17/5068 716/113 |
| 2012/0054530 A1 | 3/2012 | Schuttenberg et al. |
| 2013/0049827 A1* | 2/2013 | Bucelot ................ G06F 1/10 327/144 |
| 2014/0266376 A1 | 9/2014 | Kuo et al. |

OTHER PUBLICATIONS

Vaisband et al., "Low Power Clock Network Design," J. Low Power Electron, Appl. 2011, vol. 1, (Published May 19, 2011) pp. 219-246.

Rueben, et al., "Capacitance Driven Clock Mesh Synthesis to Minimize Skew and Power Dissipation," IEICE Electronics Express, vol. 10, No. 24. (Nov. 2013) (13 pages).

Search Report for GB Application No. GB1420364.0, dated May 15, 2015 (4 pages).

\* cited by examiner

REDUCING DYNAMIC CLOCK SKEW AND/OR SLEW IN AN ELECTRONIC CIRCUIT

PRIOR FOREIGN APPLICATION

This application claims priority from United Kingdom (GB) patent application number 1420364.0, filed Nov. 17, 2014, which is hereby incorporated herein by reference in its entirety.

BACKGROUND

Digital electronic circuits may utilize high frequency clock signals, within the range of multiple GHz. Those signals are typically distributed over a wide area of the chip (>400 mm$^2$), thereby travelling a large distance (many millimeters), while the arrival times of the signals have to be within small time windows (less than 10 ps). To distribute the signals, a clock tree is used and the distribution area is divided into smaller pieces, every piece having disjoint parts of the clock tree. The arrival times of the clock signal will be impacted by process, voltage and temperature variations on the disjoint parts of the clock distribution network for any adjacent sub-mesh pair.

SUMMARY

In one or more aspects, a method is provided herein to reduce dynamic clock skew and/or slew in an electronic circuit caused by varying physical parameters. The method includes: referencing a layout database and/or a netlist of a design for the electronic circuit before its manufacturing, the design comprising a clock mesh having adjacent sub-meshes driven by at least partially disjoint clock trees and connecting outputs of leaf level drivers in the design, the clock trees being driven by a common root tree, wherein clock trees of adjacent sub-meshes are connected at a given level by a shorting bar and wherein the sub-meshes contain dummy buffers at a level equal or higher than the shorting bar level; identifying a set of neighboring buffer pairs, each comprising active buffers and adjacent sub-meshes, which are connected by the shorting bar; for each neighboring buffer pair of the set: placing a dummy buffer for each of their active buffers in the adjacent sub-meshes close to the active buffers; routing an input for a first dummy buffer located in a first sub-mesh to an output of an active buffer in a second sub-mesh; routing an input of a second dummy buffer located in the second sub-mesh to an output of an active buffer in the first sub-mesh; and connecting inputs of the first and second dummy buffers to the shorting bar.

Systems and computer program products relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

Embodiment of the present invention are described in detail below, with reference to the drawings, in which.

DETAILED DESCRIPTION

Figure 1:
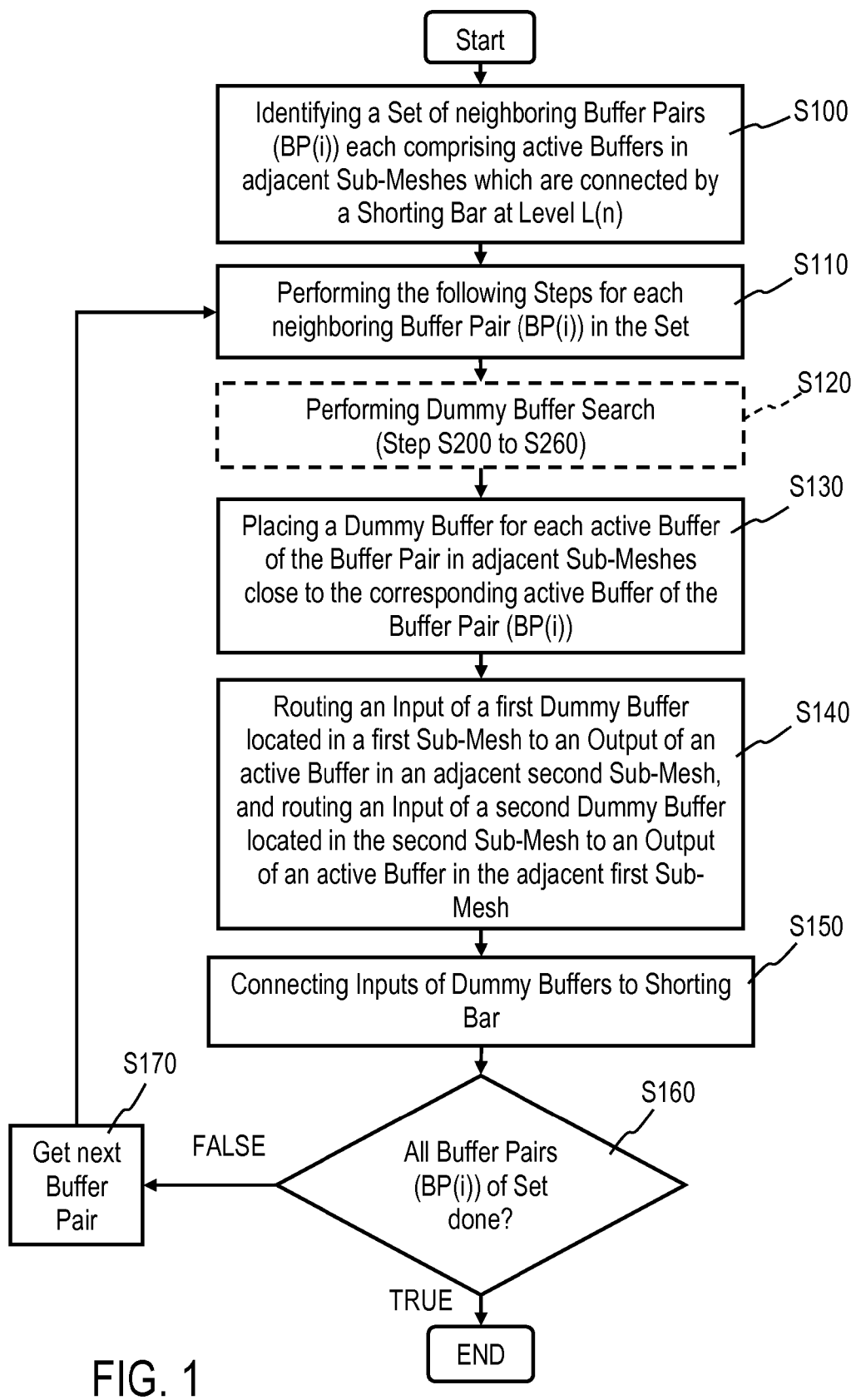
FIG. 1 is a schematic flow diagram of a method to reduce dynamic clock skew and/or slew in an electronic circuit, in accordance with one or more aspects of the present invention.

The present invention relates in general to the field of electronic circuit designs, and in particular to a method to reduce dynamic clock skew and/or slew in an electronic circuit, and a corresponding electronic circuit with reduced dynamic clock skew and/or slew. Still more particularly, the present invention relates to a data processing program and a computer program product for reducing dynamic clock skew and/or slew in an electronic circuit.

To reduce dynamic clock skew and/or slew impacts, wires shortening one or more clock trees at a certain level are introduced, referred to as shorting bars. As disclosed herein, various embodiments of the present invention make use of these shorting bars, and extend the clock tree to further reduce the impact of the physical effects and improved signal quality with respect to skew and slew.

Thus, a technical problem underlying the present invention is to provide a method to reduce dynamic clock skew and/or slew in an electronic circuit, and a corresponding electronic circuit with reduced dynamic clock skew and/or slew.

Accordingly, in one aspect of the present invention, a method is provided to reduce dynamic clock skew and/or slew in an electronic circuit caused by varying physical parameters, wherein a layout database and/or a netlist of a design for the electronic circuit is provided before its manufacturing, the design comprising a clock mesh having adjacent sub-meshes driven by at least partially disjoint clock trees and connecting the outputs of the leaf level drivers in the design, the clock trees being driven by a common root tree, wherein clock trees of adjacent sub-meshes are connected at a given level by a shorting bar; and wherein the sub-meshes contain dummy buffers at a level equal or higher than the shorting bar level, the method comprising: identifying a set of neighboring buffer pairs each comprising active buffers in adjacent sub-meshes, which are connected by the shorting bar; for each neighboring buffer pair of the set perform the following: placing a dummy buffer for each of their active buffers in the adjacent sub-meshes close to the active buffers; routing an input of a first dummy buffer located in a first sub-mesh to an output of an active buffer in a second sub-mesh; routing an input of a second dummy buffer located in the second sub-mesh to an output of an active buffer in the first sub-mesh, and connecting inputs of the first and second dummy buffers to the shorting bar.

In one or more further aspects of the present invention, the method also comprises searching for dummy buffers in the adjacent sub-meshes starting with the shorting bar level.

In one or more further aspects of the present invention, the found dummy buffers may be placed close to the active buffers in the adjacent sub-meshes in case a level of the found dummy buffers equals the shorting bar level.

In one or more further aspects of the present invention, the found dummy buffers may be changed to active buffers in case the level of the found dummy buffers is higher than the shorting bar level.

In one or more further aspects of the present invention, in case the level of the found dummy buffers is higher than a certain level, additional buffer stages may be inserted, placed and routed, wherein additional dummy buffers are added to the shorting bar level.

In one or more further aspects of the present invention, additional dummy buffers may be added to the shorting bar level in case the level of the found dummy buffers equals the certain level.

In one or more further aspects of the present invention, the additional dummy buffers may be placed close to the active buffers in the adjacent sub-meshes.

In another aspect of the present invention, an electronic circuit is provided, comprising a clock mesh having adjacent sub-meshes driven by at least partially disjoint clock trees and connecting the outputs of the leaf level drivers in the design, the clock trees being driven by a common root tree, wherein clock trees of adjacent sub-meshes are connected at a given level by a shorting bar, and wherein the sub-meshes contain dummy buffers at a level equal or higher than the shorting bar level, and a set of neighboring buffer pairs each comprise active buffers in adjacent sub-meshes, which are connected by the shorting bar. Each neighboring buffer pair of the set comprises a dummy buffer for each of their active buffers in the adjacent sub-meshes placed close to the active buffers, wherein an input of a first dummy buffer located in a first sub-mesh is routed to an output of an active buffer in a second sub-mesh, and wherein an input of a second dummy buffer located in the second sub-mesh is routed to an output of an active buffer in the first sub-mesh, and the inputs of the first and second dummy buffers are connected to the shorting bar.

In one or more aspects of the present invention, a data processing program for execution in a data processing system comprises software code portions for performing a method to reduce dynamic clock skew and/or slew in an electronic circuit, such as disclosed herein, when the program is run on the data processing system.

In yet another aspects of the present invention, a computer program product stored on a computer-usable medium is provided, comprising computer-readable program means for causing a computer to perform a method to reduce dynamic clock skew and/or slew in an electronic circuit when the program is run on the computer.

Advantageously, aspects of the present invention improve the slew and/or skew between two clock sub-meshes of an integrated circuit for the case of large on chip delay variations and offer greater design robustness against chip variation.

Further aspects of the present invention extend implementing shorting bars between sub-meshes by adding formerly not existing balance buffers also called dummy relay buffers. The drawback is a small increase in total power dissipation.

An additional aspect, is to add balance buffers and put those balance buffers from one sub-mesh into the other sub-mesh area close to the nearest clock tree buffer needed. The additional buffers accelerate late buffers within the other sub-mesh and/or delay the early buffers within the other sub-mesh.

The above, as well as additional purposes, features, and advantages of the present invention will become apparent in the following detailed written description.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
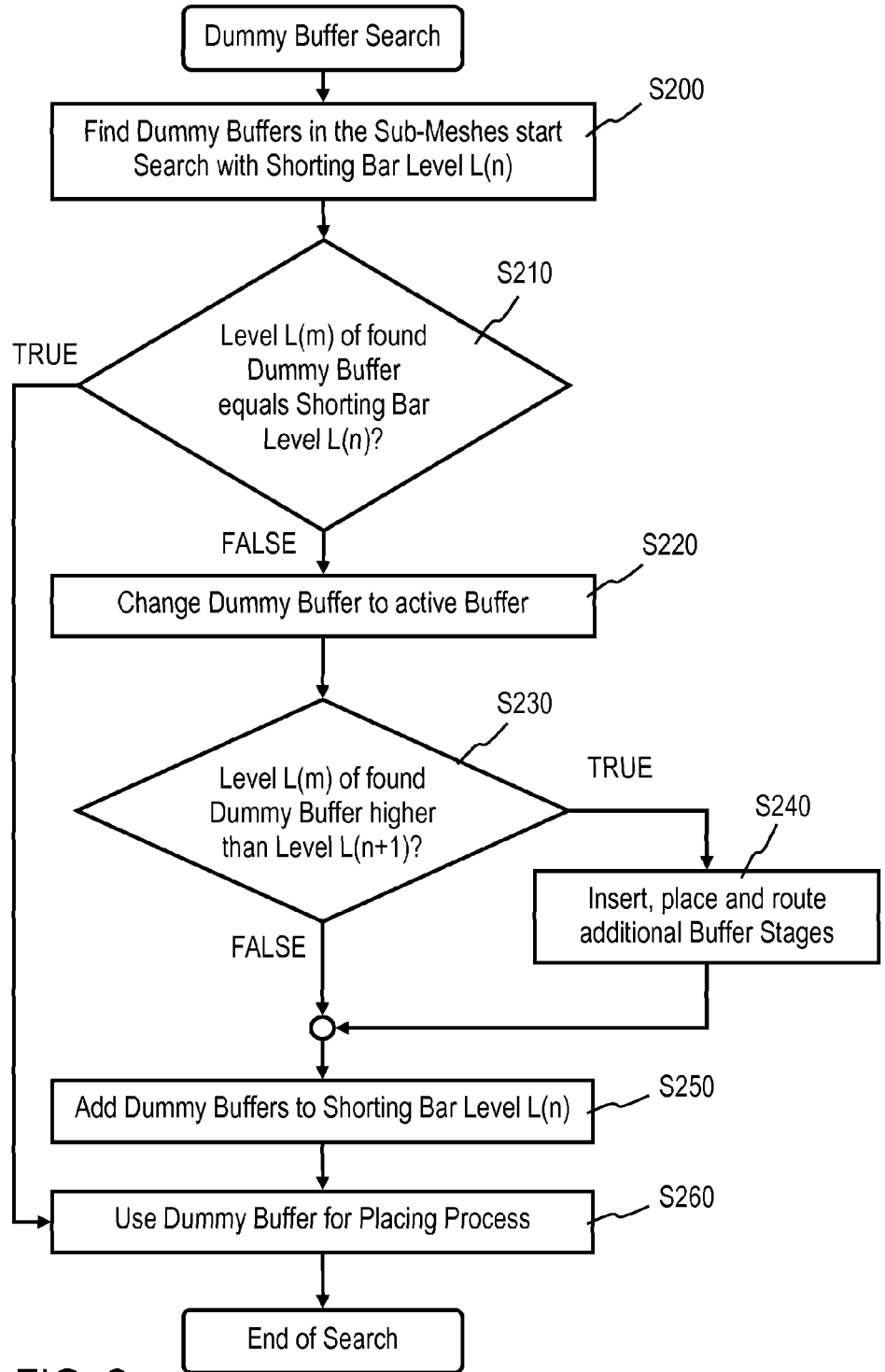
FIG. 2 is a schematic flow diagram of a dummy buffer search process usable by the method of FIG. 1 to reduce dynamic clock skew and/or slew in an electronic circuit, in accordance with one or more aspects of the present invention.

FIG. 1 shows one embodiment of a method to reduce dynamic clock skew and/or slew in an electronic circuit, in accordance with an aspect of the present invention; FIG. 2 shows a dummy buffer search process which can be used by the method of FIG. 1 to reduce dynamic clock skew and/or slew in an electronic circuit; and FIGS. 3 to 9 show a section of an electronic circuit in different states during processing the method to reduce dynamic clock skew and/or slew in an electronic circuit of FIGS. 1 and 2.

Referring to FIGS. 3 to 9, the exemplary section of the electronic circuit comprises a clock mesh 1 having two adjacent sub-meshes 10, 20 driven by at least partially disjoint clock trees 5, 7 and connecting the outputs of leaf level drivers 12, 22 in the design. The clock mesh further includes a number of levels L(n−1) to L(n+3), wherein each level comprises at least on active buffer R. The clock trees 5, 7 are driven by a common root tree 3, wherein clock trees 5, 7 of adjacent sub-meshes 10, 20 are connected at a given level L(n) by a shorting bar SB. The sub-meshes 10, 20 further contain dummy buffers D at a level L(m) equal or higher than the shorting bar level L(n). A layout database and/or a netlist of a design for the electronic circuit are provided and referenced before its manufacturing.

Referring to FIG. 1, a method is presented to reduce dynamic clock skew and/or slew in an electronic circuit caused by varying physical parameters includes identifying in a step S100 a set of neighboring buffer pairs BP(i) each comprising active buffers R1, R2 in adjacent sub-meshes 10, 20, which are connected by a shorting bar SB. The following steps are performed for each buffer pair BP(i) in the set. In step S130, for each of their active buffers R1, R2 in the adjacent sub-meshes 10, 20, a dummy buffer D1, D2 is placed close to the active buffers R1, R2. In step S140, an input of a first dummy buffer D1 located in a first sub-mesh 10 is routed to an output of an active buffer R in a second sub-mesh 20, and an input of a second dummy buffer D2 located in the second sub-mesh 20 is routed to an output of an active buffer R in the first sub-mesh 10. In step S150, the inputs of the first and second dummy buffer D1, D2 are connected to the shorting bar SB. In step S160, it is checked, if all puffer pairs BP(i) of the set are processed. If not, the next buffer pair is obtained S170 and steps S120 to S140 are repeated. If all puffer pairs BP(i) are processed, the method is ended.

Still referring to FIG. 1, a step 120 of searching for dummy buffers D in the adjacent sub-meshes 10, 20 can be inserted between steps S110 and S130. FIG. 2 shows one embodiment of the dummy buffer search process in more detailed. Referring to FIG. 2, the dummy buffer search process is starting with step S200. According to step S200, the search for dummy buffers in the adjacent sub-meshes 10, 20 starts with the shorting bar level L(n). In step S210, it is checked, if a level L(m) of a found dummy buffer D equals the shorting bar level L(n) (L(m)=L(n)). If the dummy buffer D was found in the shorting bar level L(n), then the process proceeds with step S260 and the found dummy buffer D is used in the placing process according to step S130 of FIG. 1. If the dummy buffer D was not found in the shorting bar level L(n), then the process proceeds with step S220. This means, that the level L(m) the dummy buffer D is found is higher than the shorting bar level L(n) (L(m)>L(n)). In step S220, the found dummy buffer D is changed to an active buffer R. In step S230 it is checked, if a level L(m) of a found dummy buffer D is higher than a certain shorting bar level L(n+1) (L(m)>L(n+1)). If the dummy buffer D was found in a Level L(m) higher than the certain level L(n+1), then the process proceeds with step S240 and additional buffer stages are inserted, placed and routed in step S240 according to the sub-mesh design. Then the process proceeds with step S250. If the dummy buffer D was found in the certain level L(n+1) (L(m)=L(n+1)), then the process proceeds with step S250. In step S250, dummy buffers D are added to the shorting bar level L(n) of the sub-meshes 10, 20. In step S260, the added dummy buffers are used in the placing process according to step S130 of FIG. 1.

Figure 3:
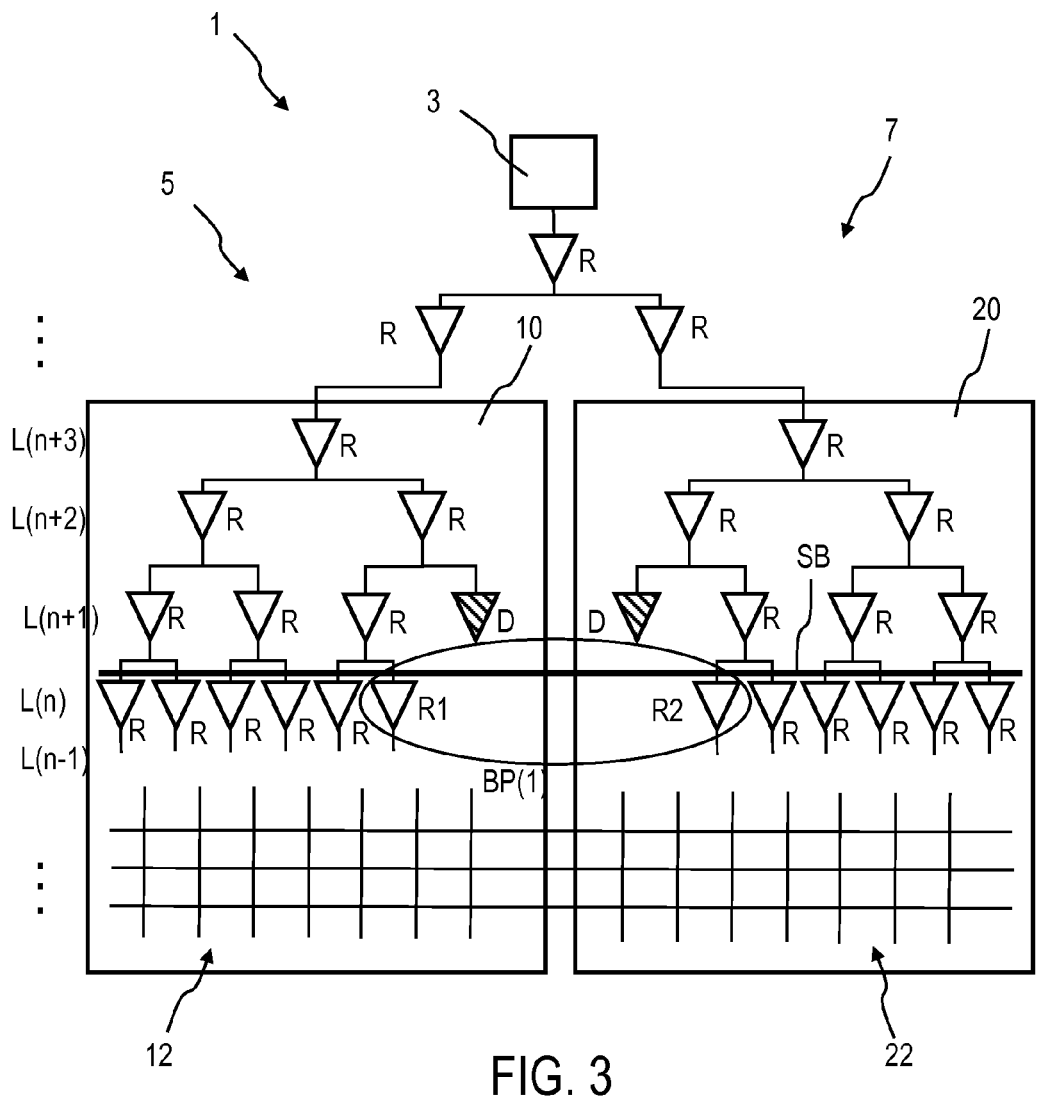
FIG. 3 is a schematic block diagram of a section of an electronic circuit in a first state during processing to reduce dynamic clock skew and/or slew in an electronic circuit, in accordance with one or more aspects of the present invention.
Figure 4:
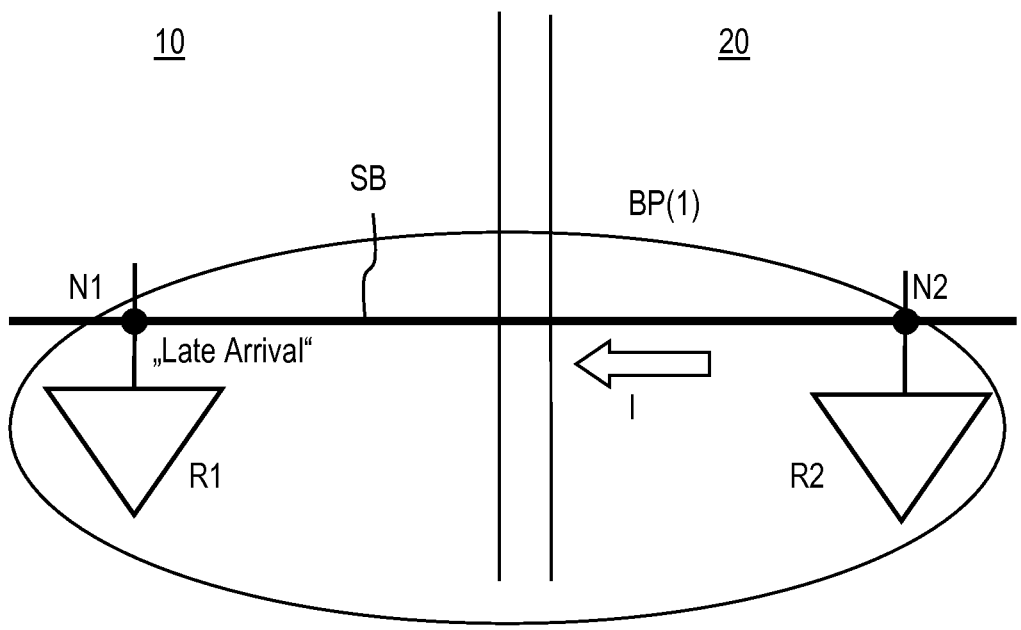
FIG. 4 is a more detailed block diagram of the section of the electronic circuit in the first state shown in FIG. 3, in accordance with one or more aspects of the present invention.

Referring to FIGS. 3 and 4, the electronic circuit comprises the clock mesh 1 having adjacent sub-meshes 10, 20 driven by at least partially disjoint clock trees 5, 7 and connecting the outputs of the leaf level drivers 12, 22 in the design. The clock trees 5, 7 are driven by a common root tree 3, wherein clock trees 5, 7 of adjacent sub-meshes 10, 20 are connected at a given level L(n) by a shorting bar SB. The sub-meshes 10, 20 contain dummy buffers D at a level L(m) equal or higher than the shorting bar level L(n), and include a set of neighboring buffer pairs BP(i) each comprising active buffers R1, R2 in adjacent sub-meshes 10, 20, which are connected by the shorting bar SB. In the shown embodiment, the sub-meshes 10, 20 contain exemplary dummy buffers D at a level L(m)=L(n+1) which is higher than the shorting bar level L(n). The set of neighboring buffer pairs BP(i) is represented exemplary by a first neighboring buffer pair BP(1) comprising two active buffers R1, R2 in adjacent sub-meshes 10, 20. During the dummy buffer search process the dummy buffers D at L(m)=L(n+1) are found in step S200.

Referring to FIG. 4, an input of the first active buffer R1 of the first neighboring buffer pair BP(1) is connected in the first sub-mesh 10 at node N1 to the shorting bar SB, and an input of the second active buffer R2 of the first neighboring buffer pair BP(1) is connected in the second sub-mesh 20 at node N2 to the shorting bar SB. Because of process, voltage and temperature variations impacts on the disjoint parts of the clock distribution network 1, an arrival time of the clock signal at node N1 in the first sub-mesh 10 may be late compared to an arrival time of the clock signal at node N2 in the second sub-mesh 20. To reduce such impacts, the shorting bar SB introduces a balance current I flowing from the second node N2 to the first node N1.

Various aspects of the invention make use of the shorting bar SB and extend the clock trees 5, 7 to further reduce the impact of those physical effects and improve signal quality with respect to skew and slew.

Figure 5:
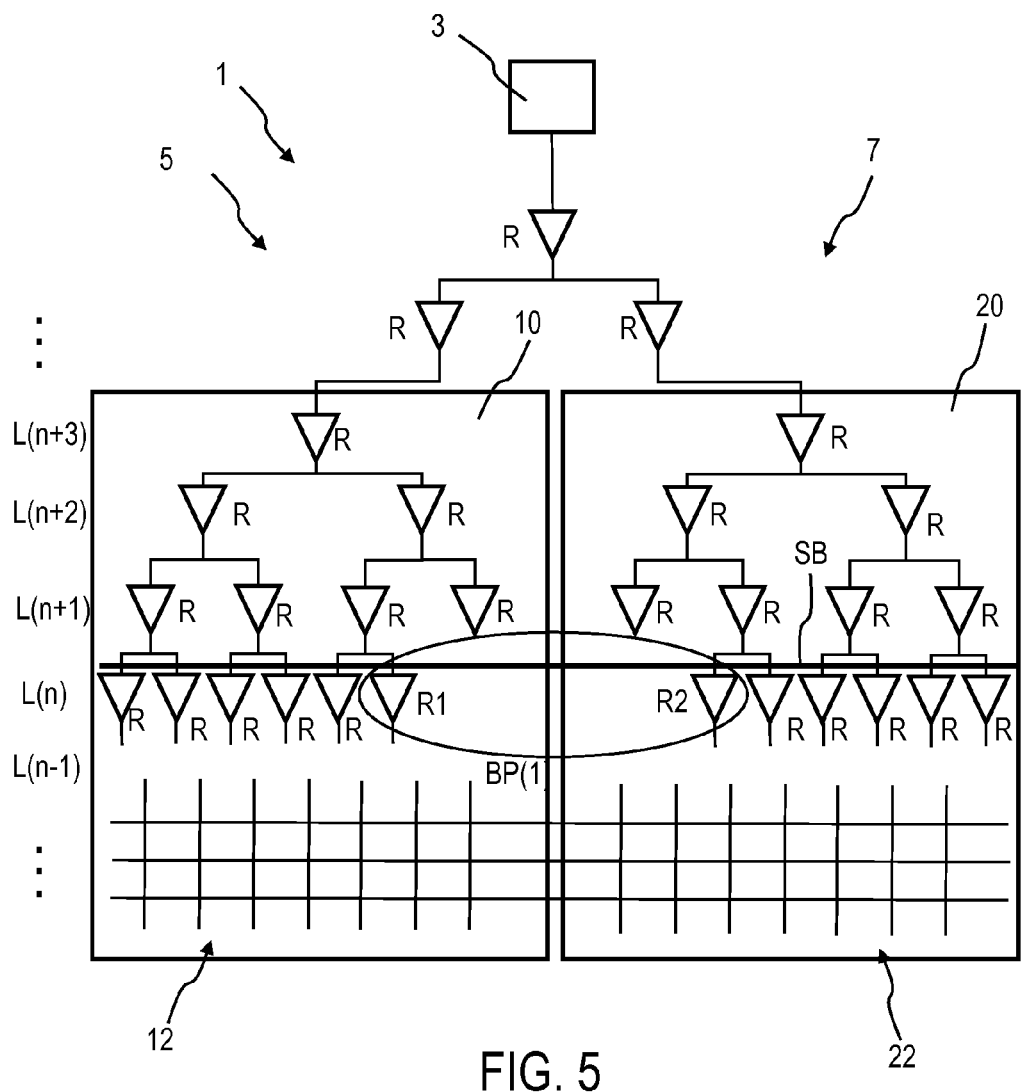
FIG. 5 is a schematic block diagram of the section of the electronic circuit in a second state during processing to reduce dynamic clock skew and/or slew in an electronic circuit, in accordance with one or more aspects of the present invention.

Since the dummy buffers D are found in a level L(m)=L(n+1) higher than the shorting bar level L(n), the found dummy buffers D are changed to active buffers R according to step S220. This second state during processing of the method to reduce dynamic clock skew and/or slew in an electronic circuit is shown in FIG. 5.

Figure 6:
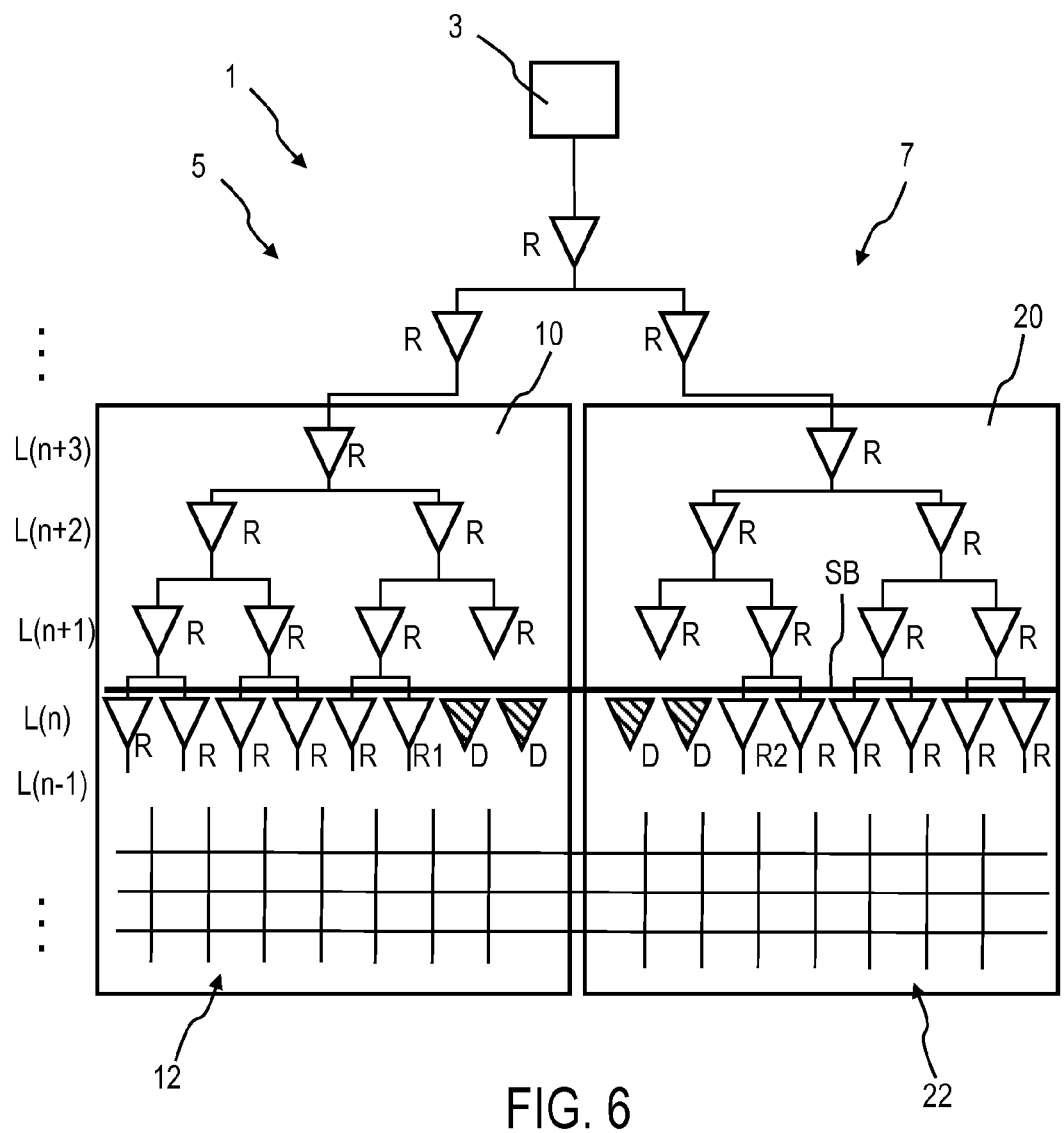
FIG. 6 is a schematic block diagram of the section of the electronic circuit in a third state during processing to reduce dynamic clock skew and/or slew in an electronic circuit, in accordance with one or more aspects of the present invention.

Referring to FIG. 6, additional dummy buffers D may be added to the sub-meshes 10, 20 at shorting bar level SB according to step S250. According to step S260, these dummy buffers D are used in the placing process performed in step S130. Therefore the additional dummy buffers D are placed close to the corresponding active Buffers R1, R2 of the first neighboring buffer pair BP(1). This third state during processing the method to reduce dynamic clock skew and/or slew in an electronic circuit is shown in FIG. 6.

In another embodiment of the invention not shown, dummy buffers D may be found in a level L(m)=L(n) equal to the shorting bar level L(n). In this case the found dummy buffers D are used in the placing process in step S130, according to step S260. So no additional dummy buffers D are added to the sub-meshes 10, 20 and the found dummy buffers D are placed close to the corresponding active Buffers R1, R2 of the first neighboring buffer pair BP(1).

In a further embodiment of the invention not shown, dummy buffers D may be found in a level L(m)>L(n+1) higher than the shorting bar level L(n). Therefore, the found dummy buffers D are changed to active buffers R according to step S220 and additional buffer stages are inserted, placed and routed based on the design of the sub-meshes 10, 20, according to step S240. Then additional dummy buffers D are added to the sub-meshes 10, 20 at shorting bar level SB according to step S250. According to step S260, these dummy buffers D are used in the placing process performed in step S130. Therefore, the additional dummy buffers D are placed close to the corresponding active Buffers R1, R2 of the first neighboring buffer pair BP(1).

Figure 7:
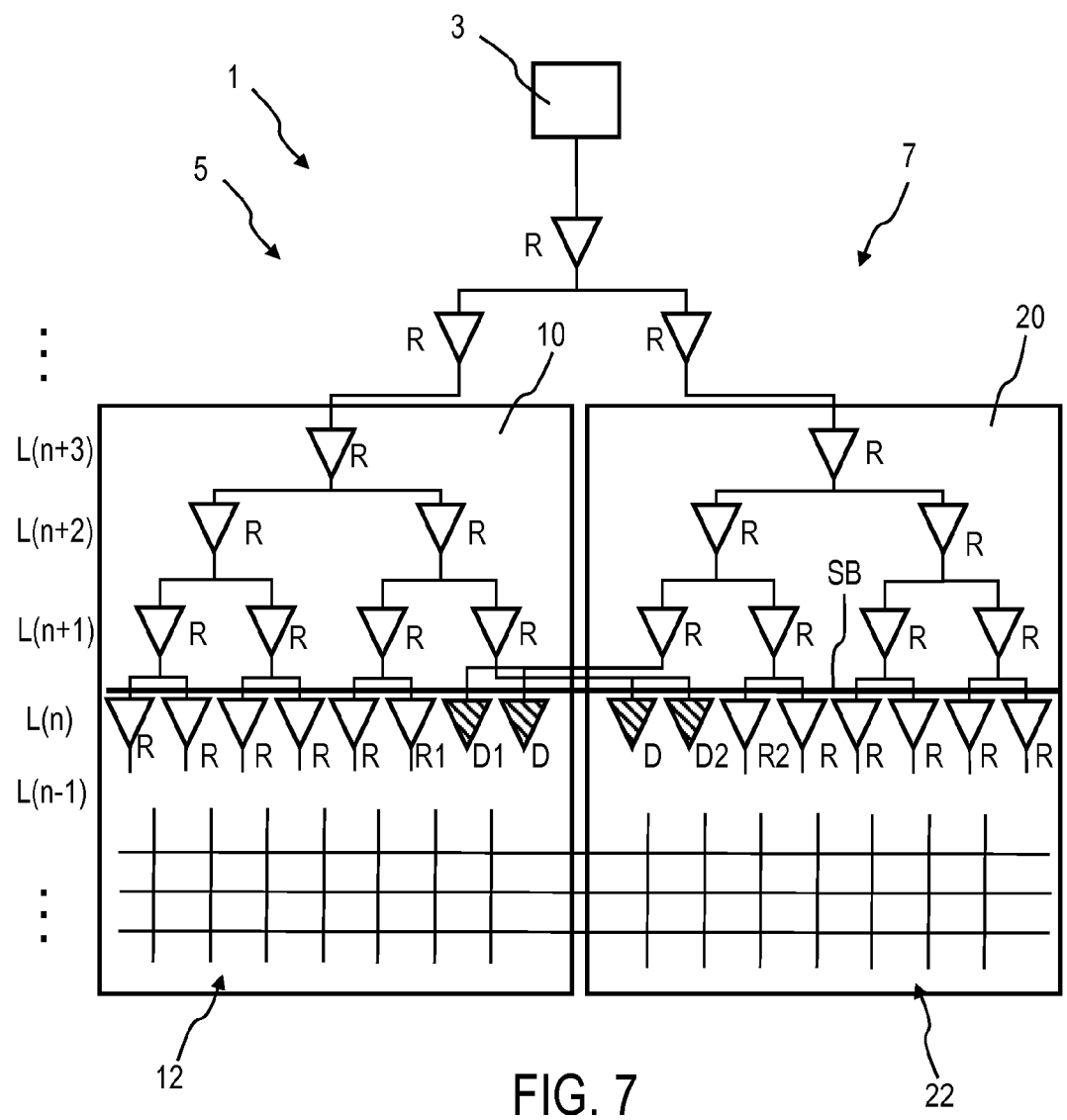
FIG. 7 is a schematic block diagram of the section of the electronic circuit in a fourth state during processing to reduce dynamic clock skew and/or slew in an electronic circuit, in accordance with one or more aspects of the present invention.

Referring to FIG. 7, in the shown state, an input of a first dummy buffer D1 located in the first sub-mesh 10 is routed to an output of an active buffer R in the second sub-mesh 20, and an input of a second dummy buffer D2 located in the second sub-mesh 20 is routed to an output of an active buffer R in the first sub-mesh 10.

Figure 8:
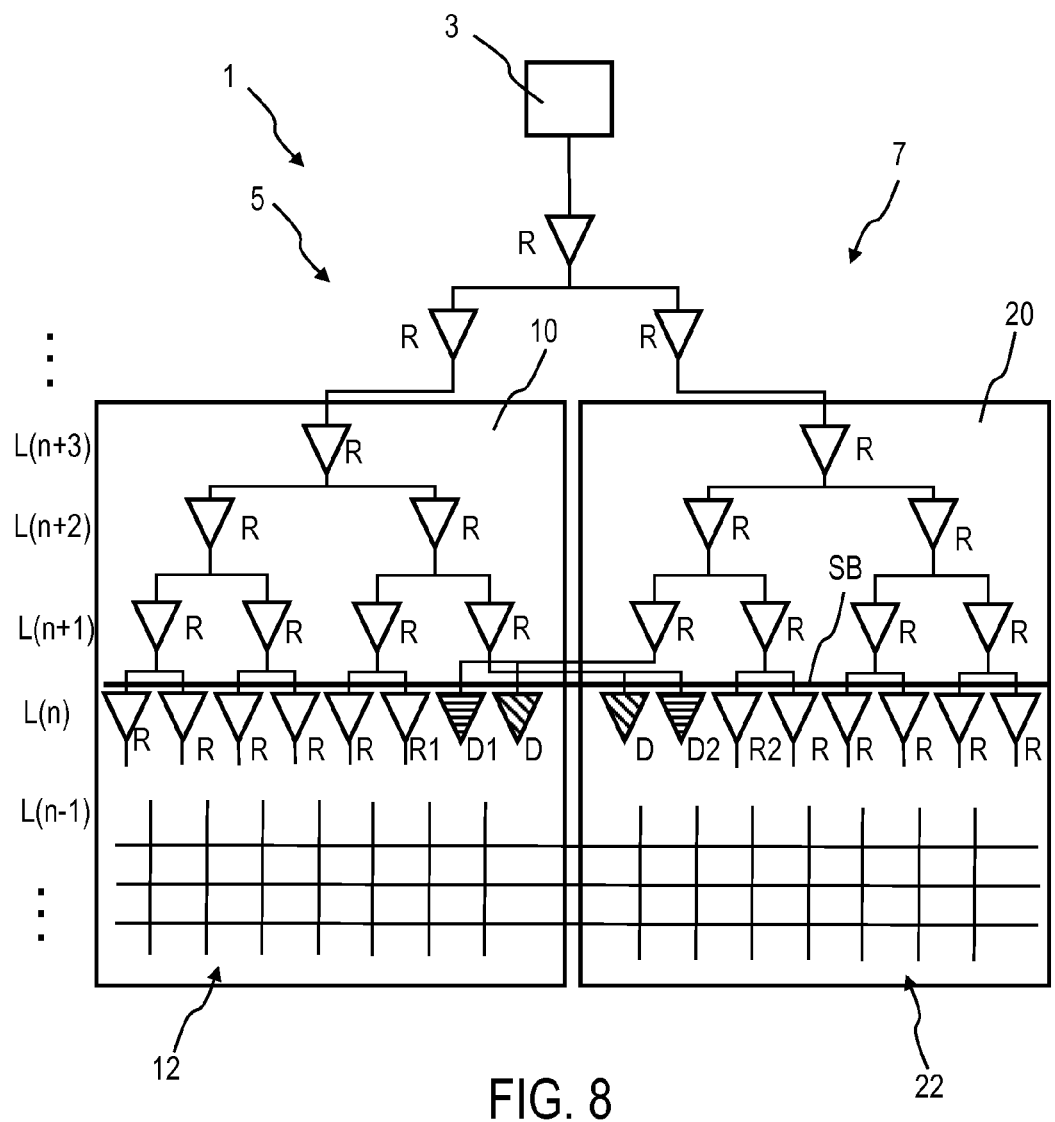
FIG. 8 is a schematic block diagram of the section of the electronic circuit in fifth state during processing to reduce dynamic clock skew and/or slew in an electronic circuit, in accordance with one or more aspects of the present invention.
Figure 9:
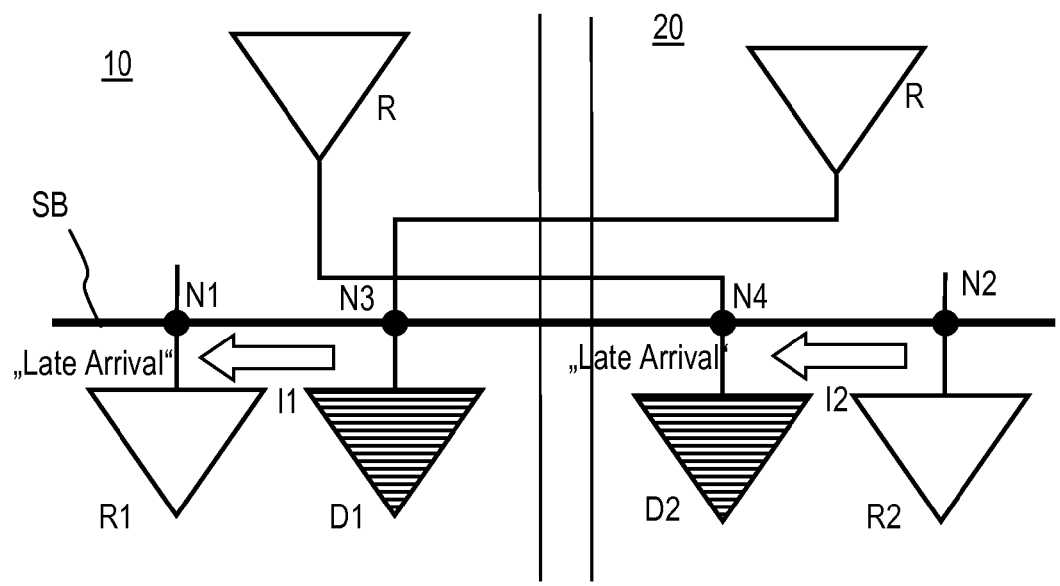
FIG. 9 is a more detailed block diagram of the section of the electronic circuit in the fifth state shown in FIG. 8, in accordance with one or more aspects of the present invention.

Referring to FIGS. 8 and 9, in the shown state, the inputs of the first and second dummy buffer D1, D2 are connected to the shorting bar SB. Referring to FIG. 9, an input of the first dummy buffer D1 located close to the first active buffer R1 of the first neighboring buffer pair BP(1) is connected in the first sub-mesh 10 at node N3 to the shorting bar SB, and an input of the second dummy buffer D2 located close to the second active buffer R2 of the first neighboring buffer pair BP(1) is connected in the second sub-mesh 20 at node N4 to the shorting bar SB. Since the input of the first dummy buffer D1 placed in the first sub-mesh 10 is connected to an active buffer R placed in the second sub-mesh 20, an arrival time of the clock signal at node N1 in the first sub-mesh 10 is late compared to an arrival time of the clock signal at node N3 in the first sub-mesh 10. Therefore, a first balance current I1 is flowing from the third node N3 to the first node N1 to further reduce the impacts of physical effects and improve signal quality with respect to skew and slew. So, the first dummy buffer acts as "accelerating component" in the first sub-mesh 10. Since the input of the second dummy buffer D2 placed in the second sub-mesh 20 is connected to an active buffer R placed in the first sub-mesh 10, an arrival time of the clock signal at node N4 in the second sub-mesh 20 is late compared to an arrival time of the clock signal at node N2 in the second sub-mesh 20. Therefore, a second balance current I2 is flowing from the second node N2 to the fourth node N4 to further reduce the impacts of physical effects and improve signal quality with respect to skew and slew. So, the second dummy buffer acts as "delaying component" in the second sub-mesh 20.

In summary, one or more aspects of the invention make use of shorting bars and extend the clock trees to further reduce the impact of physical effects and improve signal quality with respect to skew and slew.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of reducing dynamic clock skew and/or slew in a digital electronic circuit caused by varying physical parameters, the method comprising:
   referencing a layout database and/or a netlist of a design for the digital electronic circuit before its manufacturing, the design comprising a clock mesh having adjacent sub-meshes driven by at least partially disjoint clock trees and connecting outputs of leaf level drivers in the design, the clock trees being driven by a common root tree, wherein clock trees of adjacent sub-meshes are connected at a given level (L(n)) by a shorting bar (SB), and wherein the sub-meshes contain dummy buffers at a level (L(m)) equal or higher than the shorting bar level (L(n));
   modifying the digital electronic circuit design to reduce dynamic clock skew and/or slew, including:
      identifying a set of neighboring buffer pairs (BP(i)) each comprising active buffers in adjacent sub-meshes, which are connected by the shorting bar (SB);
      for each neighboring buffer pair (BP(i)) of the set:
         placing a dummy buffer for each of their active buffers in the adjacent sub-meshes close to the active buffers;
         routing an input of a first dummy buffer located in a first sub-mesh to an output of an active buffer in a second sub-mesh;
         routing an input of a second dummy buffer located in the second sub-mesh to an output of an active buffer in the first sub-mesh; and
         connecting inputs of the first and second dummy buffers to the shorting bar (SB).

2. The method of claim 1, further comprising searching for dummy buffers in the adjacent sub-meshes starting with the shorting bar level (L(n)).

3. The method of claim 2, wherein in case the level (L(m)) of the found dummy buffers equals the shorting bar level (L(n)), the found dummy buffers are placed close to the active buffers in the adjacent sub-meshes.

4. The method of claim 2, wherein in case the level (L(m)) of the found dummy buffers is higher than the shorting bar level (L(n)), (L(m)>L(n)), the found dummy buffers are changed to active buffers.

5. The method of claim 4, wherein in case the level (L(m)) of the found dummy buffers is higher than a certain level (L(n+1)), (L(m)>L(n+1)), additional buffer stages are inserted, placed and routed, wherein additional dummy buffers are added to the shorting bar level (L(n)).

6. The method of claim 5, wherein in case the level (L(m)) of the found dummy buffers equals the level (L(n+1)), (L(m)=L(n+1)), additional dummy buffers are added to the shorting bar level (L(n)).

7. The method of claim 6, wherein the additional dummy buffers are placed close to the active buffers in the adjacent sub-meshes.

8. A system to reduce dynamic clock skew and/or slew in a digital electronic circuit caused by varying physical parameters, the system comprising:
   a memory; and
   a processing device communicatively coupled to the memory, wherein the system performs a method comprising:
      referencing a layout database and/or a netlist of a design for the digital electronic circuit before its manufacturing, the design comprising a clock mesh having adjacent sub-meshes driven by at least partially disjoint clock trees and connecting outputs of leaf level drivers in the design, the clock trees being driven by a common root tree, wherein clock trees of adjacent sub-meshes are connected at a given level (L(n)) by a shorting bar (SB), and wherein the sub-meshes contain dummy buffers at a level (L(m)) equal or higher than the shorting bar level (L(n));
      modifying the digital electronic circuit design to reduce dynamic clock skew and/or slew, including:
         identifying a set of neighboring buffer pairs (BP(i)) each comprising active buffers in adjacent sub-meshes, which are connected by the shorting bar (SB);
         for each neighboring buffer pair (BP(i)) of the set:
            placing a dummy buffer for each of their active buffers in the adjacent sub-meshes close to the active buffers;
            routing an input of a first dummy buffer located in a first sub-mesh to an output of an active buffer in a second sub-mesh;
            routing an input of a second dummy buffer located in the second sub-mesh to an output of an active buffer in the first sub-mesh; and
            connecting inputs of the first and second dummy buffers to the shorting bar (SB).

9. The system of claim 8, further comprising searching for dummy buffers in the adjacent sub-meshes starting with the shorting bar level (L(n)).

10. The system of claim 9, wherein in case the level (L(m)) of the found dummy buffers (D) equals the shorting bar level (L(n)), the found dummy buffers are placed close to the active buffers in the adjacent sub-meshes.

11. The system of claim 9, wherein in case the level (L(m)) of the found dummy buffers is higher than the shorting bar level (L(n)), (L(m)>L(n)), the found dummy buffers are changed to active buffers.

12. The system of claim 11, wherein in case the level (L(m)) of the found dummy buffers is higher than a certain level (L(n+1)), (L(m)>L(n+1)), additional buffer stages are inserted, placed and routed, wherein additional dummy buffers are added to the shorting bar level (L(n)).

13. The system of claim 12, wherein in case the level (L(m)) of the found dummy buffers equals the level (L(n+1)), (L(m)=L(n+1)), additional dummy buffers are added to the shorting bar level (L(n)).

14. The system of claim 13, wherein the additional dummy buffers are placed close to the active buffers in the adjacent sub-meshes.

15. A computer program product for reducing dynamic clock skew and/or slew in a digital electronic circuit caused by varying physical parameters, the computer program product comprising:

a computer readable storage medium having computer readable program instructions embodied therewith, the computer readable program instructions being executable by a processor to perform a method comprising:
referencing a layout database and/or a netlist of a design for the digital electronic circuit before its manufacturing, the design comprising a clock mesh having adjacent sub-meshes driven by at least partially disjoint clock trees and connecting outputs of leaf level drivers in the design, the clock trees being driven by a common root tree, wherein clock trees of adjacent sub-meshes are connected at a given level (L(n)) by a shorting bar (SB), and wherein the sub-meshes contain dummy buffers at a level (L(m)) equal or higher than the shorting bar level (L(n));
modifying the digital electronic circuit design to reduce dynamic clock skew and/or slew, including:
identifying a set of neighboring buffer pairs (BP(i)) each comprising active buffers in adjacent sub-meshes, which are connected by the shorting bar (SB);
for each neighboring buffer pair (BP(i)) of the set:
placing a dummy buffer for each of their active buffers in the adjacent sub-meshes close to the active buffers;
routing an input of a first dummy buffer located in a first sub-mesh to an output of an active buffer in a second sub-mesh;
routing an input of a second dummy buffer located in the second sub-mesh to an output of an active buffer in the first sub-mesh; and
connecting inputs of the first and second dummy buffers to the shorting bar (SB).

16. The computer program product of claim 15, further comprising searching for dummy buffers in the adjacent sub-meshes starting with the shorting bar level (L(n)).

17. The computer program product of claim 16, wherein in case the level (L(m)) of the found dummy buffers equals the shorting bar level (L(n)), the found dummy buffers are placed close to the active buffers in the adjacent sub-meshes.

18. The computer program product of claim 16, wherein in case the level (L(m)) of the found dummy buffers is higher than the shorting bar level (L(n)), (L(m)>L(n)), the found dummy buffers are changed to active buffers.

19. The computer program product of claim 18, wherein in case the level (L(m)) of the found dummy buffers is higher than a certain level (L(n+1)), (L(m)>L(n+1)), additional buffer stages are inserted, placed and routed, wherein additional dummy buffers are added to the shorting bar level (L(n)).

20. The computer program product of claim 19, wherein in case the level (L(m)) of the found dummy buffers equals the level (L(n+1)), (L(m)=L(n+1)), additional dummy buffers are added to the shorting bar level (L(n)).

* * * * *